(12) United States Patent
Tsujii

(10) Patent No.: US 6,486,691 B2
(45) Date of Patent: *Nov. 26, 2002

(54) TESTER FOR A SEMICONDUCTOR IC CIRCUIT HAVING MULTIPLE PINS

(75) Inventor: Toshiyuki Tsujii, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/368,578

(22) Filed: Aug. 5, 1999

(65) Prior Publication Data

US 2002/0000823 A1 Jan. 3, 2002

(30) Foreign Application Priority Data

Apr. 2, 1999 (JP) .......................................... 11-096551

(51) Int. Cl.[7] ................................................ G01R 31/26
(52) U.S. Cl. ....................................................... 324/765
(58) Field of Search .......................... 324/765; 714/744, 714/738, 742, 700, 731, 736

(56) References Cited

U.S. PATENT DOCUMENTS 4,928,278 A * 5/1990 Otsuji et al. .................... 371/1
5,970,073 A * 10/1999 Matsuda et al. ........... 371/27.1

FOREIGN PATENT DOCUMENTS

JP          5-150005          6/1993

* cited by examiner

Primary Examiner—N. Le
Assistant Examiner—Etienne P LeRoux
(74) Attorney, Agent, or Firm—Burns, Doane, Swecker & Mathis, LLP

(57) ABSTRACT

A tester for testing a semiconductor IC circuit having multiple pins includes a timing signal generator and a test signal generator for outputting a test signal to an input pin of a semiconductor IC circuit. The timing signal generating device can supply timing signals to one or more of the test signal generating devices.

10 Claims, 2 Drawing Sheets

TESTER FOR A SEMICONDUCTOR IC CIRCUIT HAVING MULTIPLE PINS

BACKGROUND OF THE INVENTION

1. Field of the Invention

The present invention relates to a tester for testing a semiconductor IC circuit having multiple pins.

2. Description of the Prior Art

FIG. 2 is a block diagram of a tester for testing a semiconductor IC circuit having multiple pins, in the prior art. A timing signal generator 1 generates a test period signal, which commands to generate a test pattern. The timing signal generator 1 generates also six timing signals TS1–TS6. When a pattern address controller 2 receives the test period signals from the timing signal generator 1, the pattern address controller 2 outputs a reading-out address, which is used when a test pattern is read out.

When a pattern memory 3 receives the reading-out address from the pattern address controller 2, it outputs a test pattern having a leading address corresponding to the received reading-out address. When a formatter 4 receives the timing signals from the timing signal generator 1, it generates a test signal on the basis of the test pattern supplied from the pattern memory 3, according to the timing signals. A pin electronic circuit 5 amplifies and processes the test signal generated by the formatter 4 and outputs the test signal to an input pin of a semiconductor IC circuit. A controller 6 controls the timing of the generation of the test period signal in the timing signal generator 1, and the selection of the timing signals to be used in the formatter 4.

The function of the tester for testing a semiconductor IC circuit having multiple pins in the prior art is explained below.

A great many of test patterns are stored in the pattern memory 3 of a tester, and the timing signal generator 1 can output many sort of timing signals, so that the tester can estimate the functions of many sort of LSIs, for example, MPU or ASIC, namely the tester is assured to be a general purpose tester for testing a semiconductor IC circuit having multiple pins.

Recently, semiconductor IC circuits tend to have multiple pins, because the structure and function of ICs become more and more complex. As a result, a tester for testing such a semiconductor IC circuit must have a circuit shown in FIG. 2 in a form of a hard ware circuit for each of the input/output pins of a semiconductor IC circuit. The hard ware circuit of FIG. 2 is shown as a circuit for sending test signals to a pin 1 of a semiconductor IC circuit. Of course, a circuit having a structure same as FIG. 2 is prepared for each of the pins of a semiconductor IC circuit.

When the hardware circuit estimates a semiconductor IC circuit, at first, the timing signal generator 1 generates, under the control of the control device 6, a test period signal to send to the pattern address controller 2. The test period signal commands to generate a test pattern. At the same time, the timing signal generator 1 outputs six timing signals TS1–TS6 to the formatter 4.

The pattern address controller 2 has a counter for counting the number of receiving times of the test period signal from the timing signal generator 1. When the pattern address controller 2 receives the test period signal from the timing signal generator 1, the pattern address controller 2 is triggered to output the counted value of the counter as a reading-out address, which is used when a test pattern is read out.

When the pattern memory 3 receives the reading-out address from the pattern address controller 2, it outputs a test pattern having a leading address identical to the reading-out address. For example, when the pattern address controller 2 receives an address "1000" as a reading-out address, the test pattern stored at the address "1000" is outputted. In general, a test pattern is a signal pattern comprised of an appropriately combined "1" and "0".

When the formatter 4 receives six timing signals TS1–TS6 from the timing signal generator 1, it selects timing signals, under the control of the control device 6, so as to generate a test signal on the basis of the test pattern sent from the pattern memory 3, according to the selected timing signals. For example, when the logical value of the test pattern is "1", a test signal at HIGH level is outputted, and when the logical value of the test pattern is "0", a test signal at LOW level is outputted, as shown in FIG. 3. The standing-up edge and the standing-down edge of each pulse constituting the test signal are controlled by the selected timing signals.

The pin electronic circuit 5 amplifies and processes the test signal generated by the formatter 4 and outputs the signal to an input pin of a semiconductor IC circuit.

The tester in the prior art can generate test signals having a complex wave form, using all the timing signals TS1–TS6. However, such a tester has drawbacks that it is necessary to prepare a timing signal generator, etc, for each of the input/output pins of a semiconductor IC circuit. Therefore, the size of the circuit of the tester increases according to the number of the input/output pins of a semiconductor IC circuit, hence, the price of a tester for testing a semiconductor IC circuit having multiple pins increases accordingly.

Japanese patent application JP 5-150005-A discloses a tester for testing a semiconductor IC circuit having multiple pins, in which timing signals generated by a timing signal generator are commonly used by a formatter for a pin 1 and another formatter for a pin 2. This tester has the drawback that when all the timing signals are supplied to the formatter for a pin 1, the other formatter for a pin 2 can not receive any timing signal and can not provide any test signal to the pin 2.

SUMMARY OF THE INVENTION

An object of the present invention is to eliminate these problems of the testers for testing a semiconductor IC circuit having multiple pins as in the prior art.

Another object of the present invention is to provide a tester for common use, which can be fabricated cheaply, by suppressing the augmentation of the size of the tester circuit for testing a semiconductor IC circuit having multiple pins, which may increase according to the number of the pins of a semiconductor IC circuit.

The object of the present invention is attained by a tester for testing a semiconductor IC circuit having multiple pins.

More precisely, the object is attained by a tester having a timing signal generating means, which can send timing signals to one of the test signal generating means and to more than one test signal generating means.

The timing signal generating means can be controlled to send timing signals to all of the test signal generating means or to send to at least one of the test signal generating means.

In an embodiment of the tester for testing a semiconductor IC circuit having multiple pins according to the present invention, the timing signal generating means supplies the timing signals to at least one of the test signal generating means.

In an embodiment of the tester according to the present invention, the timing signal generating means supplies the timing signal to one of the test signal generating means, and the test signal generating means generates a test signal, using all the timing signal outputted from the timing signal generating means.

In an embodiment of the tester according to the present invention, the timing signal generating means supplies the timing signals to both the test signal generating means, and the test signal generating means generate a test signal, using all the timing signal outputted from the timing signal generating means, so that identical wave form test signals are generated for two input pins of a semiconductor IC circuit.

In an embodiment of the tester according to the present invention, the timing signal generating means supplies the timing signal to both the test signal generating means, and the test signal generating means generate a test signal, using different set of the timing signals outputted from the timing signal generating means, so that different wave form test signals are generated for two input pins of a semiconductor IC circuit.

In an embodiment of the tester according to the present invention, the pattern generating means are comprised of a plurality of memories, and when the timing signal generating means output timing signals to one of the test signal generating means, the memories are used as one sequential memory, and when the timing signal generating means output timing signals to both of the test signal generating means, the memories are used as two separated memories.

In an embodiment of the tester according to the present invention, delay circuits are inserted in the timing signal transmission lines connecting the timing signal generating means and one of the test signal generating means.

DETAILED DESCRIPTION OF THE PREFERRED EMBODIMENT

EMBODIMENT 1

Figure 1:
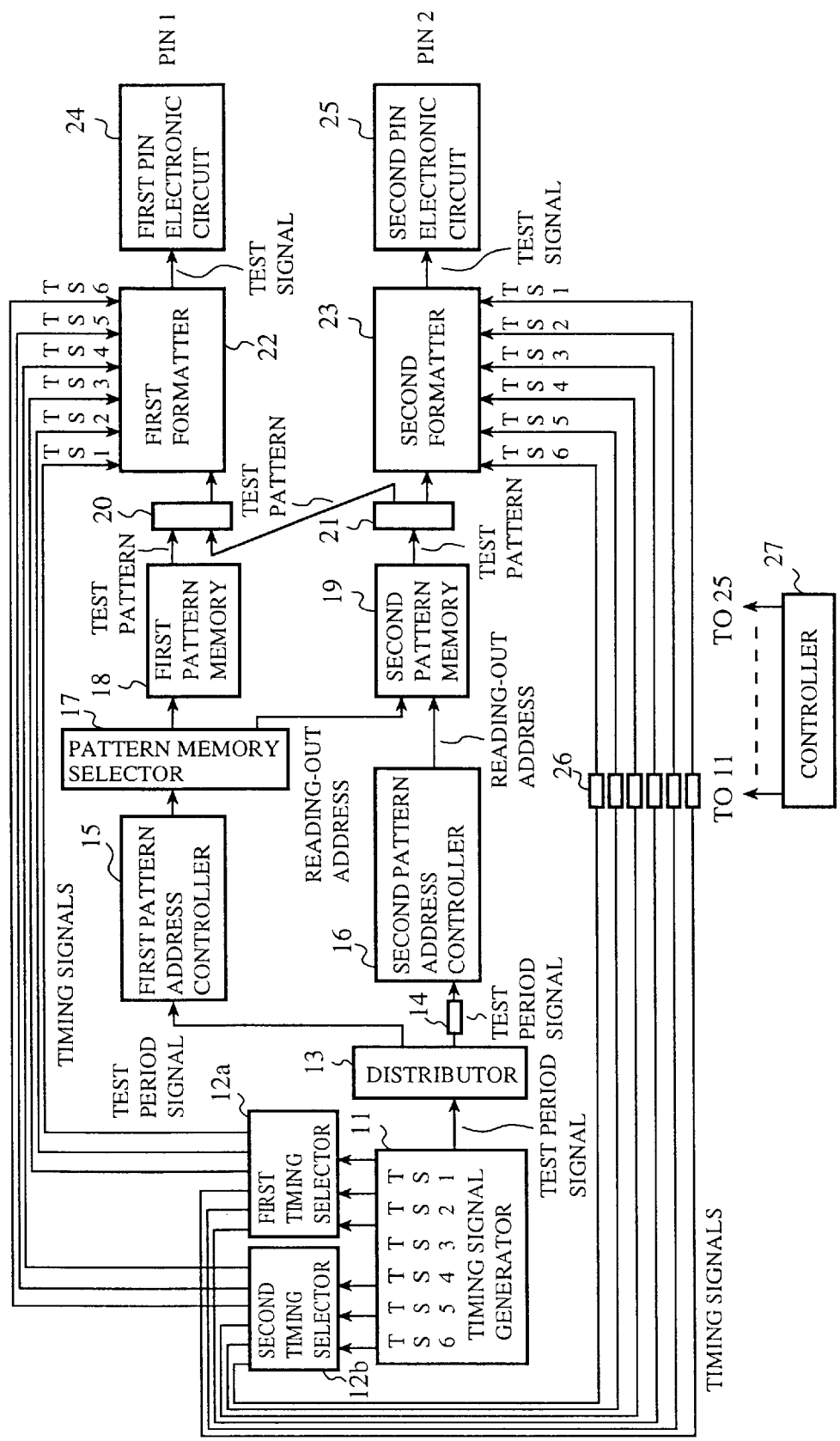
FIG. 1 is a block diagram of a tester for testing a semiconductor IC circuit multiple pins according to the embodiment 1 of the present invention.

The tester for testing a semiconductor IC circuit having multiple pins according to the embodiment 1 is explained below, referring to FIG. 1.

A timing signal generator 11 (a component of timing signal generating means) generates a test period signal and six timing signals TS1–TS6. The test period signal commands to generate a test pattern. A first timing selector 12a (a component of timing signal generating means) sends timing signals TS1–TS3 to at least one of first and second formatters 22, 23. A second timing selector, 12b (a component of timing signal generating means) sends timing signals TS4–TS6 to at least one of the formatters 22, 23. A distributor 13 distributes the test period signal to first and second pattern address controllers 15, 16. A delay circuit 14 is inserted in a line connecting between the distributor 13 and the second pattern address controller 16.

When the first and second pattern address controller 15,16 (a component of pattern generating means) receive the test period signal from the timing signal generator 11 through the distributor 13, the first and second pattern address controller 15,16 output a reading-out address, which is used when a test pattern is read out. A pattern memory selector 17 outputs the reading-out address sent from the first pattern address controller 15 to either of first and second pattern memories 18 or 19. When the first pattern memory 18 (a component of pattern generating means) receives the reading-out address from the pattern memory selector 17, it outputs a test pattern which has a leading address identical to the received reading-out address. When the second pattern memory 19 (a component of pattern generating means) receives the reading-out address from either of the second pattern address controller 16 or the pattern memory selector 17, it outputs a test pattern which has a leading address at the received reading-out address.

A first test pattern selector 20 receives a test pattern either from the pattern memory 18 or a second test pattern selector 21 and outputs it to the first formatter 22. The second pattern selector 21 receives the test pattern from the pattern memory 19 and outputs it either of the first test pattern selector 20 or a second formatter 23. When the first formatter 22 (first test signal generating means) receives the timing signals generated in the timing signal generator 11, it generates a test signal on the basis of the test pattern sent from the first pattern selector 20, according to the timing signals. When the second formatter 23 (second test signal generating means) receives the timing signals generated in the timing signal generator 11, it generates a test signal on the basis of the test pattern sent from the second pattern selector 21, according to the timing signals.

A first pin electronic circuit 24 (a component of first test signal generating means) outputs the test signal generated in the first formatter 22 to a pin 1 (an input pin) of a semiconductor IC circuit, after amplifying and processing it. A second pin electronic circuit 25 (a component of second test signal generating means) outputs the test signal generated in the second formatter 23 to a pin 2 (another input pin) of a semiconductor IC circuit, after amplifying and processing it. Delay circuits 26 are inserted in lines connecting the timing signal generator 11 and the second formatter 23 through the first and second timing selectors.

The function of the tester for testing a semiconductor IC circuit having multiple pins according to this embodiment is explained below.

The tester can generate test signal in three modes:

Mode 1: Test signal is outputted only to a pin 1 of a semiconductor IC circuit, and no test signal is sent to a pin 2 of the semiconductor. The first formatter 22 uses all the timing signals TS1–TS6 to generate a test signal;

Mode 2: Same test signals are outputted to pins 1, 2 of a semiconductor IC circuit. The first and second formatter 22, 23 use commonly all the timing signals TS1–TS6 to generate a test signal;

Mode 3: Different test signals are outputted to pins 1, 2 of a semiconductor IC circuit. The first and second formatter 22, 23 use different timing signals to generate different test signals.

Mode 1:

The timing signal generator 11 generates a test period signal under instruction of a controller 27 and outputs it to the distributor 13. The period signal commands to generate a test pattern. The distributor 13 distributes the test period signal to the first and second pattern address controllers 15, 16. The delay circuit 14 is inserted in the signal transmitting line so that the test period signals sent from the distributor 13 reach to the first and second pattern address controllers 15, 16 at a same time.

The timing generator 11 outputs timing signals TS1–TS3 to the first timing selector 12a, at the same time it outputs timing signals TS4–TS6 to the second timing selector 12b. The first and second timing selectors 12a, 12b output all the timing signals TS1–TS6 only to the first formatter 22, and no timing signal is sent to the second formatter 23.

When the first pattern address controller 15 receives the test period signal from the distributor 13, the first pattern address controller 1 is triggered by the signal to output a reading-out address, which is used when a test pattern is read out. The first address controller counts the receiving times of the test period signal from the timing signal generator 11, and outputs the counted value as a reading-out signal.

In mode 1, the second pattern address controller 16 does not output any reading-out signal, because the controller 27 does not instruct the second pattern address controller 16 to output it. Even if the second pattern address controller 16 outputs an address, the second pattern memory 19 ignores signals from the second pattern address controller 16, in the mode 1.

When the first selector 17 receives the reading-out signal from the pattern address controller 15, it compares the reading-out signal and the leading address of the second pattern memory 19 under the control of the controller 27. When the reading-out address is smaller than the leading address, the reading address is output to the first pattern memory 18. When the reading-out address is larger than the leading address, the reading address is output to the second pattern memory 19.

When the first and second pattern memories receive the reading-out address from the pattern memory selector 17, they output a test pattern which has a leading address identical to the reading-out address. For example, when the reading-out address is "1000", a test pattern stored at the address "1000" is outputted. By the way, a test pattern is a signal pattern comprised of an appropriately combined "1" and "0".

In mode 1, the second test pattern selector 21 outputs the test pattern outputted from the second pattern memory 19 to the first test pattern selector 20, and the first test pattern selector 20 outputs the test pattern received from either of the first pattern memory 18 or the second test pattern selector 21 to the first formatter 22. No test pattern is outputted to the second formatter 23.

The first formatter 22 receives six timing signals TS1–TS6 from the timing signal generator 11 through the first and second timing selectors 12a, 12b. The first formatter 22 selects timing signals from the timing signals, under the control of the controller 27, so as to generate a test signal on the basis of the test pattern sent from the first pattern selector 20, according to the selected timing signals.

Figure 3:
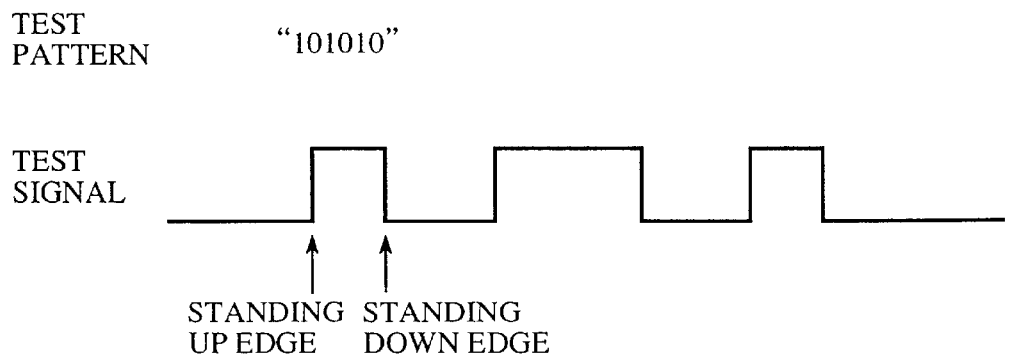
FIG. 3 shows how a test signal is generated.

As shown in FIG. 3, when the logical value of the test pattern is "1", a test signal of "H" state is outputted. When the logical value of the test pattern is "0", a test signal of "L" state is output. The standing-up edge and the standing-down edge of the pulse signal, which constitute the test signal, are controlled according to the selected timing signals.

The pin electronic circuit 24 amplifies and processes the test signal so as to output it to a pin 1 of a semiconductor IC circuit.

In mode 1, no test signal cannot be outputted to a pin 2 of the semiconductor IC circuit. However, all the timing signal TS1–TS6 can be used for generating a test signal so that rather complex wave form test signal can be generated, if it is necessary.

Mode 2:

The timing signal generator 11 generates a test period signal under instruction of a controller 27 and outputs it to the distributor 13. The test period signal commands to generate a test pattern. The distributor 13 distributes the test period signal to the first and second pattern address controllers 15, 16. The timing signal generator 11 outputs timing signals TS1–TS3 to the first timing selector 12a, at the same time it outputs timing signals TS4–TS6 to the second timing selector 12b. Differently from the mode 1, the first timing selector 12a outputs the timing signal TS1–TS3 to both the first and second formatters 22, 23. Also the second timing selector 12b outputs the timing signal TS4–TS6 to both the first and second formatters 22, 23.

If the lengths of the transmission lines connecting the first and second timing selectors 12a, 12b and the first formatter 22 are different from that of connecting the first and second timing selectors 12a, 12b and the second formatter 23 are different, the arrival timings of the timing signals to the first and second formatters do not coincide to each other. Delay circuits 26 are inserted in the transmission lines connecting the first and second timing selectors 12a, 12b and the second formatter 23 for compensating the difference of the arrival timings of the timing signals.

When the first and second pattern address controllers 15, 16 receive the test period signal from the distributor 13, they are triggered to output a reading-out address, which is used when a test pattern is read out, to the pattern memory selector 17 and the second pattern memory 19, respectively. When the pattern memory selector 17 receives the reading-out address from the first pattern address controller 15, it outputs the reading-out address to the first pattern memory 18, under the control of the controller 27.

When the first and second pattern memories 18, 19 receive a reading-out address from either of the pattern memory selector 17 or the second pattern address controller 16, they output a test pattern having a leading address identical to the received reading-out address.

In mode 2, the first test pattern selector 20 outputs the test pattern supplied from the first pattern memory 18 to the first formatter 22, and the second test pattern selector 21 outputs the test pattern supplied from the second pattern memory 19 to the second formatter 23.

The first and second formatters 22, 23 receive six timing signals TS1–TS6 from the timing signal generator 11 through the first and second timing selectors 12a, 12b. The first and second formatters 22, 23 select timing signals from the received timing signals, under the control of the controller 27, so as to generate a test signal on the basis of the test pattern sent from either of the first and second pattern selectors 20, 21 according to the selected timing signals.

When the first formatter 22 generates the test signal, the pin electronic circuit 24 amplifies and processes the test signal to output it to a pin 1 of a semiconductor IC circuit. When the second formatter 23 generates the test signal, the pin electronic circuit 25 amplifies and processes the test signal to output it to a pin 2 of a semiconductor IC circuit.

In mode 2, only an identical signal can be outputted to the pins 1 and 2. However, it is possible to output timing signals for two pins 1, 2 without using two timing generators 11. The test signals for two pins 1, 2 can be generated using all the timing signals TS1–TS6.

Mode 3:

The timing signal generator 11 generates a test period signal under instruction of a controller 27 and outputs it to the distributor 13. The period signal commands to generate a test pattern. The distributor 13 distributes the test period signal to the first and second pattern address controllers 15, 16. The timing signal generator 11 outputs timing signals TS1–TS3 to the first timing selector 12a, in the same time it outputs timing signals TS4–TS6 to the second timing selector 12b. Differently from the modes 1, 2, the first timing selector 12a outputs the timing signal TS1–TS3 to the first formatter 22. The second timing selector 12b outputs the timing signal TS4–TS6 to the second formatter 23.

When the first and second pattern address controllers 15, 16 receive the test period signal from the distributor 13, it outputs a reading-out address, which is used when a test pattern is read out. When the pattern memory selector 17 receives the reading-out address from the first pattern address controller 15, it outputs the reading-out address to the first pattern memory 18, under the control of the controller 27.

When the first and second pattern memories 18, 19 receive a reading-out address from either of the pattern memory selector 17 or the second pattern address controller 16, they output a test pattern having a leading address identical to the reading-out address.

In mode 3, the first test pattern selector 20 outputs the test pattern supplied from the first pattern memory 18 to the first formatter 22, and the second test pattern selector 21 outputs the test pattern supplied from the second pattern memory 19 to the second formatter 23.

When the first formatter 22 receives three timing signals TS1–TS3 from the timing signal generator 11 through the first timing selector 12a, the first formatter 22 selects timing signals from the received timing signals, under the control of the controller 27, so as to generate a test signal on the basis of the test pattern sent from the first pattern selector 20 according to the selected timing signals.

When the second formatter 22 receives three timing signals TS4–TS6 from the timing signal generator 11 through the second timing selector 12b, the second formatter 23 selects timing signals from the received timing signals, under the control of the controller 27, so as to generate a test signal on the basis of the test pattern sent from the second pattern selector 21 according to the selected timing signals.

When the first formatter 22 generates the test signal, the first pin electronic circuit 24 amplifies and processes the test signal to output it to a pin 1 of a semiconductor IC circuit. When the second formatter 23 generates the test signal, the second pin electronic circuit 25 amplifies and processes the test signal to output it to a pin 2 of a semiconductor IC circuit.

In mode 3, it is impossible to use all the timing signals TS1–TS6 in generating a test signal, namely a test signal is generated using the timing signals TS1–TS3 or the timing signals TS4–TS6. However, it is possible to output different wave form timing signals for outputting to pins 1, 2, without using two set of timing generators 11.

As explained, according to the tester for testing a semiconductor IC circuit having multiple pins of the embodiment 1, the timing signal generator 11 is commonly used by the first and second formatter 22, 23, and the timing signal generator can supply timing signals to both of or either of the first and second formatters 22, 23. Thus, it is possible to provide cheaply a tester for common use, by suppressing the augmentation of the size of the tester circuit, which may increase according to the number of the pins of a semiconductor IC circuit.

Furthermore, the first and second memories 18, 19 can be effectively used, because they can be used as one sequential memory, when the first and second timing selectors 12a, 12b output timing signals to one of the first and second formatter 22, 23, and they can be used as two separated memories, when the first and second timing selectors 12a, 12b output timing signals to both of the first and second formatters 22, 23.

EMBODIMENT 2

The tester for testing a semiconductor IC circuit having multiple pins according to the embodiment 1 is a tester, which generates test signals for two input pins of a semiconductor IC circuit. However, the scope of the present invention is not limited to such a tester. The tester for testing a semiconductor IC circuit having multiple pins according to the present invention can be constructed so as to output test signals for more than two input pins of a semiconductor circuit.

Figure 2:
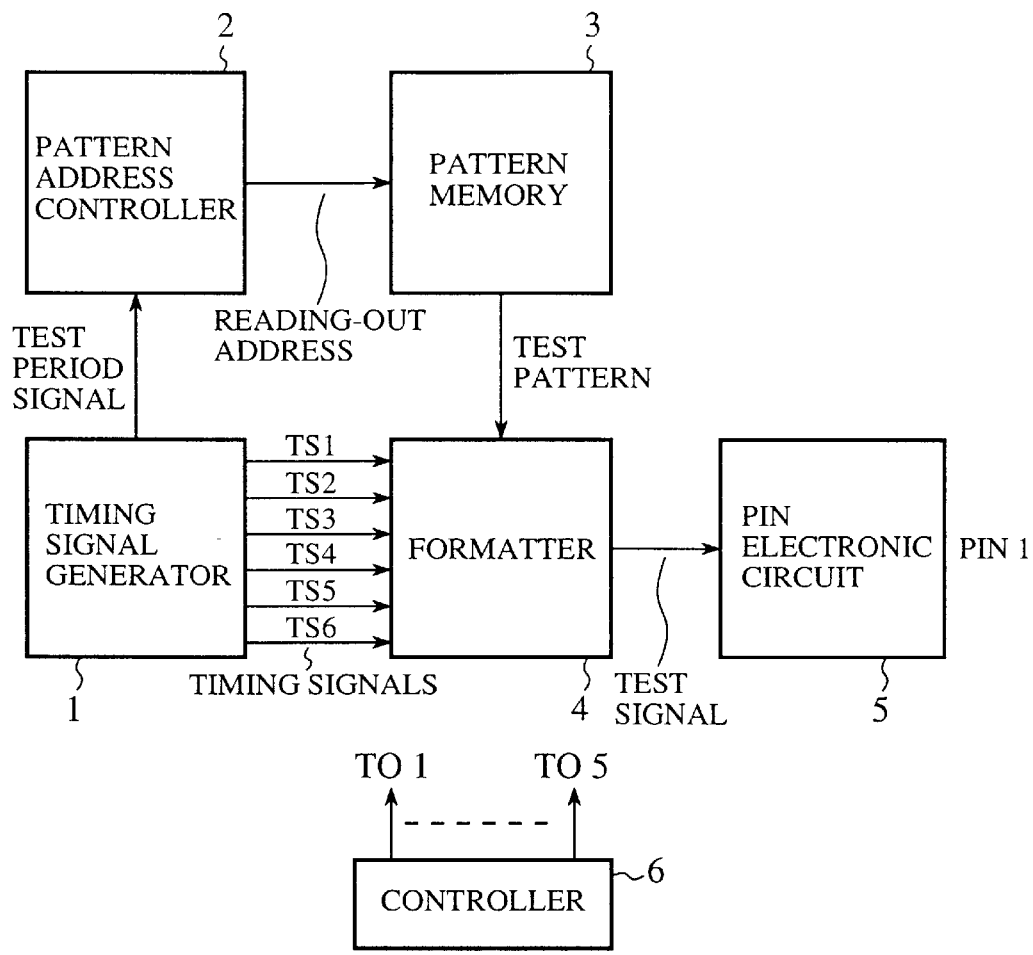
FIG. 2 is a block diagram of a tester for testing a semiconductor IC circuit having multiple pins in the prior art.

For example, a tester for testing a semiconductor IC circuit having multiple pins, which generates test signals for three input pins of a semiconductor IC circuit, has a third pattern address controller, a third pattern memory, a third formatter, a third pin electronic circuit and necessary delay circuits in addition to the components shown in FIG. 2. But it is necessary only one timing signal generator 11.

EMBODIMENT 3

The tester for testing a semiconductor IC circuit having multiple pins according to the embodiment 1 is a tester, in which the first timing selector 12a outputs the timing signals TS1–TS3 to the first formatter 22, and the second timing selector 12b outputs the timing signals TS4–TS6 to the second formatter 23. However, the scope of the present invention is not limited to such a tester. For example, it is possible that the first timing selector 12a outputs the timing signals TS1–TS2 to the first formatter 22, and the second timing selector 12b outputs the timing signals TS3–TS6 to the second formatter 23. Of course, further another combination of the timing signals is possible.

The tester for testing a semiconductor IC circuit having multiple pins according to the embodiment 1 is a tester, in which the timing signal generator 11 generates six timing signals TS1–TS6. However, the scope of the present invention is not limited to such a tester. For example, it is possible that the timing signal generator 11 generates seven or more than seven timing signals.

In the explanations of the embodiments of the present invention, the input pins of a semiconductor IC circuit were supposed to be pins 1, 2. These pins are no more than examples of pins. Of course, the other pins can be input pins of the semiconductor IC circuit.

What is claimed is:

1. A tester for testing a semiconductor IC circuit having multiple pins comprising:
   pattern generating means for generating a test pattern;
   a plurality of test signal generating means each for generating a test signal to output to a different input pin of the multiple pins of the semiconductor IC circuit, on the basis of the test pattern output from the pattern generating means according to a test period signal; and
   timing signal generating means, connected to the plurality of test signal generating means, for supplying timing signals either to one of the test signal generating means or to more than one test signal generating means, said timing signal generating means including first and second timing selectors for sending the timing signals to at least one of said test signal generating means,
   wherein one or more input pins are tested, and wherein said timing signal generating means generating the test period signal and outputting said test period signal to said pattern generating means.

2. A tester for testing a semiconductor IC circuit having multiple pins according to claim 1, wherein the plurality of test signal generating means are first test signal generating means for outputting the test signal to a pin of a semiconductor IC circuit and second test signal generating means for outputting the test signal to another pin of the semiconductor IC circuit.

3. A tester for testing a semiconductor IC circuit having multiple pins according to claim 2, wherein the timing signal generating means can supply the timing signal to one of the test signal generating means, and the test signal generating means generates a test signal, using all the timing signal outputted from the timing signal generating means.

4. A tester for testing a semiconductor IC circuit having multiple pins according to claim 2, wherein the timing signal generating means can supply the timing signal to both the test signal generating means, and the test signal generating means generate a test signal, using all the timing signal output ted from the timing signal generating means, so that identical wave form test signals are generated for two input pins of a semiconductor IC circuit.

5. A tester for testing a semiconductor IC circuit having multiple pins according to claim 2, wherein the timing signal generating means can supply timing signals to both of the test signal generating means, and the test signal generating means generate a test signal, using different set of the timing signals outputted from the timing signal generating means, so that different wave form test signals are generated for two input pins of a semiconductor IC circuit.

6. A tester for testing a semiconductor IC circuit having multiple pins according to claim 2, wherein the pattern generating means are comprised of a plurality of memories, and the memories are used as one sequential memory, when the timing signal generating means output timing signals to one of the test signal generating means, and the memories are used as two separated memories, when the timing signal generating means outputs timing signals to both of the test signal generating means.

7. A tester for testing a semiconductor IC circuit having multiple pins according to claim 2, wherein delay circuits are inserted in the timing signal transmission lines connecting the timing signal generating means and the second test signal generating means.

8. A tester for testing a semiconductor IC circuit having multiple pins according to claim 6, wherein a delay circuit delays a test period signal to reach the plurality of pattern memories at a same time.

9. A tester for testing a semiconductor IC circuit having multiple pins according to claim 1, wherein each test signal generating means comprising a) a formatter receiving the timing signals generated from the timing signal generating means and generating a test signal based on the test pattern from the pattern generating means and b) a pin electronic circuit outputting the test signal generated in said formatter means to one input pin.

10. A tester for testing a semiconductor IC circuit having multiple pins according to claim 1, wherein said first timing selector sending a predetermined number of the timing signals to the at least one test signal generating means and said second timing selector sending remaining timing signals to the at least one test signal generating means.

* * * * *